United States Patent [19]

Nakatsugawa

[11] Patent Number: 4,935,310
[45] Date of Patent: Jun. 19, 1990

[54] COPPER FOIL FOR A PRINTED CIRCUIT AND A METHOD FOR THE PRODUCTION THEREOF

[75] Inventor: Hiroshi Nakatsugawa, Yokohama, Japan

[73] Assignee: Furukawa Circuit Foil Co., Ltd., Tokyo, Japan

[21] Appl. No.: 405,069

[22] Filed: Sep. 7, 1989

Related U.S. Application Data

[63] Continuation of Ser. No. 133,197, Dec. 15, 1987, abandoned, which is a continuation of Ser. No. 654,052, Sep. 24, 1984, abandoned, which is a continuation of Ser. No. 512,578, Jul. 11, 1983, abandoned, which is a continuation of Ser. No. 244,803, Mar. 17, 1981, abandoned.

[30] Foreign Application Priority Data

Apr. 3, 1980 [JP] Japan .................................. 55-42834

[51] Int. Cl.$^5$ ........................ B32B 15/08; B32B 15/20
[52] U.S. Cl. .................................... 428/607; 428/626; 428/675; 428/935
[58] Field of Search .............. 428/606, 607, 625, 626, 428/671, 675, 926, 935; 174/68.5; 204/44.7

[56] References Cited

U.S. PATENT DOCUMENTS

| | | |
|---|---|---|
| 3,522,085 | 7/1970 | Watanabe ............................ 428/606 |
| 3,585,010 | 6/1971 | Luce et al. ........................... 428/926 |
| 3,743,583 | 7/1973 | Custonquay ....................... 204/44.7 |
| 3,808,576 | 4/1974 | Castonquay et al. ............... 338/309 |
| 3,857,681 | 12/1974 | Yates et al. ........................... 428/626 |
| 3,857,683 | 12/1974 | Castonquay ....................... 204/44.7 |
| 3,878,006 | 4/1975 | Rice .................................... 156/655 |
| 3,894,330 | 7/1975 | Bellis .................................. 228/254 |
| 4,002,778 | 1/1977 | Bellis et al. .......................... 427/98 |
| 4,201,616 | 5/1980 | Chellis et al. ...................... 174/68.5 |
| 4,220,945 | 9/1980 | Kakuhashi et al. ................. 338/308 |
| 4,503,131 | 3/1985 | Baudraud ............................ 428/675 |
| 4,714,804 | 12/1987 | Yasuda et al. ...................... 200/267 |
| 4,808,967 | 2/1989 | Rice et al. ........................... 428/667 |

FOREIGN PATENT DOCUMENTS

| | | |
|---|---|---|
| 1424129 | 2/1976 | United Kingdom . |
| 1473223 | 5/1977 | United Kingdom . |
| 2008490 | 6/1979 | United Kingdom . |
| 2010910 | 7/1979 | United Kingdom . |
| 1558919 | 1/1980 | United Kingdom . |

OTHER PUBLICATIONS

Lowenheim, F. A., *Modern Electroplating*, J. Wiley & Sons, Inc., (New York), pp. 720–721, TJ 670 E4 (1974).
Brenner, A. et al., "Electrodeposition of Alloys of Phosphorous with Nickel or Cobalt"; NBS Research Paper RP2061, vol. 44, pp. 109–119 (1950).
"Internal Stress in Electroless Nickel–Phosphorus Deposits", Bobrov et al., Chem. Abs. 86: 125403r, vol. 86, 1977.
"Nickel–Phosphorus Alloy Electroplating and Some Properties of the Electroplates", Sadakov et al., Chem. Abs. 90: 78332n, 1979.
"Solverability Improving of Electroless Nickel–Coated Metal", Chem. Abs. 94: 161209f, 1981.

*Primary Examiner*—John J. Zimmerman
*Attorney, Agent, or Firm*—Frishauf, Holtz, Goodman & Woodward

[57] ABSTRACT

A copper-clad laminated board which comprises a resin substrate and a copper foil laminated on said substrate, said copper foil having a resin substrate bonding surface coated completely with a layer consisting essentially of a phosphorus-containing nickel layer formed by electrodeposition, said substrate being in face-to-face contact with said bonding surface of said copper foil.

4 Claims, No Drawings

COPPER FOIL FOR A PRINTED CIRCUIT AND A METHOD FOR THE PRODUCTION THEREOF

This application is a continuation of Ser. No. 07/133,197 filed Dec. 15, 1987 (abandoned); which is a continuation of Ser. No. 06/654,052 filed Sept. 24, 1984 (abandoned); which is a continuation of Ser. No. 06/512,578 filed July 11, 1983 (abandoned); which is a continuation of Ser. No. 06/244,803 filed Mar. 17, 1981 (abandoned).

The present invention relates to copper foil for a printed circuit and a method for the production thereof. More particularly, the present invention relates to copper foil to be used for the production of a copper-clad laminated board for a printed circuit, which comprises copper foil having a phosphorus-containing nickel layer on a copper layer (copper foil material), and a method for the production thereof.

Printed circuits are widely used in a variety of electronic applications such as radios, televisions, computors, or telephone exchangers. There have recently been remarkable developments in this field and accordingly there is an increasing need for high quality boards for printed circuits.

With conventional copper-clad laminated boards for printed circuits, it frequently happens that brown stains or spots appear at the interface between the copper foil and the substrate resin layer. (The surface which is in contact with the resin layer will hereinafter be referred to as "a bonding surface of the copper foil".) Such stains impair the outer appearance of the circuit and adversely affect the dielectric properties of the resin.

Further, there has been a recent tendency that an increasing number of heat treatments at high temperatures are involved during the process for the production of boards for printed circuits, whereby the adhesion between the copper foil and the resin is likely to deteriorate due to thermal degradation thus leading to a serious practical problem. The formation of brown stains and deterioration in the adhesion between the copper foil and the resin, are believed to be caused mainly by the chemical reactions between the copper foil and the resin layer. However, no adequate analysis of the causes has yet been done.

The following methods have been proposed to overcome these drawbacks.

U.K. Pat. No. 1,211,494 and Japanese Patent Publication 43555/1978 corresponding to said U.K. Patent described a method in which 0.2 to 1.0 g/m² of nickel, cobalt, chromium or stainless steel is plated on the bonding surface of the copper foil for a printed circuit. Japanese Patent Publication No. 35711/1976 discloses a method in which at least $10.16 \times 10^{-6}$ cm (i.e. 4 microinches) of indium, zinc, tin, nickel, cobalt, a copper-zinc alloy or a copper-tin alloy is electrodeposited on the surface of copper foil. Japanese Patent Publication No. 39376/1978 discloses electroplating on a copper foil, zinc, brass, nickel, cobalt, chromium, cadmium, tin or bronze. Further, Laid-open Japanese Patent Application No. 16863/1974 describes a method in which a layer of a metal which is less noble than copper, such as aluminum, chromium, manganese, iron, cobalt, nickel, zinc, cadmium, tin, lead or indium, or its alloy with copper or with other metals, such as copper-zinc, copper-cadmium, copper-tin, or tin-zinc, is formed on the surface of copper foil.

Among these metals which form a layer on a copper foil, nickel, tin, cobalt and a copper-tin alloy, have the drawback that they cannot or can hardly be etched with an ammonium persulfate solution which is one of the etchants commonly used in the printed circuit operations.

On the other hand, in the method utilizing a zinc plated layer, a so-called undercutting phenomenon occurs wherein the etchant penetrates into the interface between the copper foil constituting a printed circuit and the resin during etching with an ammonium persulfate solution or a cupric chloride solution. Another great drawback is that there also occurs penetration of etchant between the foil constituting the printed circuit and the resin in the treatment with a solution containing hydrochloric acid as used in the printing circuit technique. On the other hand, in the method for plating brass (copper-zinc alloy), there is no practical method except for using cyanide baths, which will cause, however, great troubles from the standpoint of working environment as well as environmental pollution.

In the aforesaid method for plating nickel, there is also an attempt to improve the method so that the nickel layer may be etched with an ammonium persulfate solution. Laid-open U.K. Patent Application GB No. 2010910A discloses etching of both the copper foil and the nickel layer using the same etchant by incorporating 0.05% to 10.0% of sulfur in the nickel layer.

However, as seen from the trace experiment of the Example in said laid-open U.K. Patent Application, said nickel-plated copper foil was not sufficiently improved to the extent that it becam readily etchable with an ammonium persulfate solution, and there still remains the problem that the etching performance with a cupric chloride solution is rather deteriorated.

The object of the present invention is to provide a copper foil for printed circuits in which the problems existing with relation to the bonding surface of the copper foil for printed circuit as mentioned above have been overcome, and a method for the production thereof.

The copper foil for printed circuit according to the present invention is capable of being etched easily and completely either with an ammonium persulfate solution or with a cupric chloride solution to give a clear substrate resin surface, and is free from the undercutting phenomenon. Further, in the copper-clad laminated board according to this invention, solution containing hydrochloric acid does not penetrate between the foil and the resinous substrate; generation of stains not occur; and strong adhesion can be maintained not only before heating but also after heating.

That is, the copper foil for printed circuit according to the present invention is characterized by having a copper layer (copper foil material) and a phosphorus-containing nickel layer formed on the bonding surface of said copper layer.

In the following, the copper foil for printed circuit according to the present invention is to be described in detail.

Copper foil for the basic copper layer may be any copper foil normally used for a printed circuit, for instance, such as electrodeposited copper foil or rolled copper foil. Further, it may be subjected to a surface roughening treatment such as etching by acid pickling, or a surface roughening treatment by electrodeposition as disclosed in U.S. Pat. Nos. 3,220,897 or 3,293,109.

The nickel layer formed on the bonding surface of the aforesaid copper foil functions to avoid generation of stains at the bonding surface, to bring about heat-resistant adhesion between the laminated resinous substrate and the foil, exhibiting no undercutting phenomenon at the time of formation of a circuit by etching and being free from liquid penetration between the foil and the resinous substrate in the step using a solution containing hydrochloric acid. Such characteristics can be achieved by coating the bonding surface of the copper foil with a nickel plated layer, of which the preferred thickness is 0.002 to 0.8 $\mu$, more preferably 0.02 to 0.2 $\mu$. With a thickness less than 0.002%, no such effect as mentioned above can be obtained. On the contrary, a thickness exceeding 0.8 $\mu$ will lower the purity of copper for the copper foil as well as the electrical properties of the copper foil and the roughness of the bonding surface of the foil with such a thickness of nickel plated layer is difficultly controllable. Further, such a thickness will cause additional economical disadvantages with respect to the treatment speed and the cost for plating materials.

The nickel layer formed on the surface of the copper foil according to the present invention is required to contain phosphorus uniformly dispersed therein, in an amount of 0.02 to 15% by weight, preferably 0.05 to 10% by weight, based on nickel. If phosphorus is contained in an amount less than 0.02%, the effect for preventing etching residue generated by the presence of nickel can only insufficiently be attained during formation of the circuit. On the other hand, with a content exceeding 15% by weight, the current efficiency during electrodeposition of nickel is remarkably lowered, whereby an unfavorable undercutting phenomenon is observed.

Next, the method for production of the copper foil according to the present invention is to be described.

The nickel layer may be formed on the copper layer according to any method such as electroplating, chemical plating or others but it is most convenient to form the nickel layer by way of electroplating.

The production method according to the present invention by way of electroplating is described below.

As a nickel plating bath, there may be employed a bath having dissolved therein a phosphorus compound soluble in a nickel plating bath, and the nickel layer can be formed on the copper layer according to conventional procedures.

As the phosphorus compounds to be employed in the present invention in the nickel plating solution, there may be mentioned, for example, sodium hypophosphite, disodium phosphite, sodium phosphotungstate, sodium metaphosphate, monosodium phosphate, nickel phosphate, nickel phosphite and so on.

In practicing the present invention by the electroplating method, the conditions such as the composition of the nickel plating bath, the bath temperature and the current density may be the same as in conventional nickel electroplating except for addition of a phosphorus compound, and no specific method is critical therefor. As for the electroplating bath, besides the bath containing nickel sulfate as a main component as widely used in recent commercial application, there may also be employed a chloride bath, a sulfamic acid bath or others.

The copper foil having the phosphorus-containing nickel layer on the bonding surface thereof, when used as the electroconductive element in the copper-clad laminated board for printed circuit, is found to exhibit the excellent results mentioned below.

That is, after lamination of the copper foil on a glass-epoxy resin substrate, there was found no staining generated between the copper foil and the substrate resin layer. The peel strength was sufficiently high after lamination, indicating values which were not substantially lowered even after heating at 300° C. for 3 minutes or heating at 180° C. for 5 hours. Etching can also be successful by use of any of the etchants such as ferric chloride solution, cupric chloride solution and ammonium persulfate solution, and the portions of the copper foil at which etching is desired to be effected can readily and completely be removed. Moreover, there was observed no penetration of the etchant into the interface between the copper foil and the resinous substrate (undercutting phenomenon). Furthermore, even by the hydrochloric acid test, simulating the treatment step using a solution containing hydrochloric acid, there was no penetration of the solution into the interface between the copper foil and the resinous substrate.

When copper foil was laminated on a polyimide substrate, the greenish brown stain observed on the substrate after removable of the copper by etching according to the method of prior art, did not occur when the copper foil was treated according to the present invention is used. Further, the copper foil can be laminated on a phenol resin substrate with improved peel strength, especially with a remarkable improvement when laminating a copper foil on a phenol resin type flameretardant substrate.

As is apparent seen from the above description, the copper foil of the present invention overcomes the drawbacks of the nickel-coated copper foil of prior art, with additional advantages in quality as well as economy such as simplification and reliability of the etching step, improvement of the quality and decrease in percentage of unacceptable products.

The production process according to the present invention is suitable for commercial production on a large scale, since it can be practiced by continuously running a copper foil material through a nickel-electroplating bath to effect plating thereon, followed by washing with water and drying.

The present invention will be illustrated by the following Examples, which should not be construed as limitative of the present invention.

EXAMPLE 1

With use of a solution containing 240 g of nickel sulfate (hexahydrate), 45 g of nickel chloride (hexahydrate), 30 g of boric acid and 5 g of sodium hydophosphite per one liter of the solution at 50° C. as the electrolyte, electroplating was applied to the matte side (i.e., the bonding surface) of electrodeposited copper foil having a thickness of 35 microns, at a current density of 2.2 A/dm$^2$ for 30 seconds. The amount of electrodeposition of nickel per apparent surface area of the matte surface corresponded to a thickness of about 0.2 micron and the surface presented a nickel colour having no lustre. The foil was washed with water and dried, and it was then subjected to the measurement of the phosphorus content in the plate nickel layer according to the usual method. The results of the measurement are shown in the Table. The copper foil was laminated on a glass-epoxy substrate to provide a copper-clad laminated board. The results obtained by measuring various properties of the laminated board are shown in the same Table.

EXAMPLE 2

With use of a solution containing 100 g of nickel sulfate (hexahydrate), 15 g of sodium citrate and 10 g of sodium hypochlorite per liter of the solution at 50° C. as the electrolyte, electroplating was applied to the matte side of the copper foil under otherwise the same conditions as in Example 1.

Then, the properties of the product were measured similarly as in Example 1 to give the results as shown in the Table.

EXAMPLE 3

With use of a solution containing 80 g of nickel sulfate (hexahydrate), 8 g of boric acid, 6 g of sodium succinate, 6 g of ammonium chloride and 24 g of sodium hypophosphite per liter of the solution at 50° C. as the electrolyte, the treatment was applied to the matte side of electrodeposited copper foil under otherwise the same conditions as in Example 1.

Then, the properties of the product were measured similarly as in Example 1 to give the results as shown in the Table.

EXAMPLE 4

With use of a solution of pH 0.8 containing 175 g of nickel sulfate (hexahydrate), 50 g of nickel chloride (hexahydrate), 50 g of phosphoric acid, 1.3 g of phosphorous acid and 15 g of nickel carbonate per one liter of the solution at 80° C. as the electrolyte, electroplating was applied to the matte side of electrodeposited copper foil at a current density of 7 A/dm$^2$ for 10 seconds to give an amount of electrodeposition of nickel per apparent surface area of the matte side corresponding to a thickness of about 0.15 micron, under otherwise the same conditions as in Example 1.

Then, the properties of the product were measured similarly as in Example 1 to give the results shown in the Table.

COMPARATIVE EXAMPLES 1-3

With use of the solutions as used in the above Examples from which sodium hypophosphite was omitted as the electrolytes, the same treatments were applied to the respective matte sides of electrodeposited copper foil under otherwise the same conditions as in Examples 1, 2 and 3, respectively, to provide Comparative examples 1, 2 and 3, respectively.

Then, the properties of the products were measured similarly as in Example 1 to obtain the results as shown in the Table.

TABLE

| | Phosphorus content in nickel layer (%) | Etching residue Etching condition A | Etching residue Etching conditon B | Peel strength of copper foil laminated on a glass-epoxy substrate* (Kg/cm) No heat treatment after lamination | Peel strength of copper foil laminated on a glass-epoxy substrate* (Kg/cm) After heating at 300° C. for 3 minutes after lamination |
|---|---|---|---|---|---|
| Example 1 | 6 | none | none | 2.03 | 1.87 |
| Example 2 | 7 | none | none | 2.05 | 1.87 |
| Example 3 | 8 | none | none | 1.97 | 1.95 |
| Example 4 | 2 | none | none | 2.07 | 2.02 |
| Comparative example 1 | — | none | much | 2.05 | 1.30 |
| Comparative example 2 | — | none | much | 2.06 | 1.17 |
| Comparative example 3 | — | none | much | 1.95 | 1.28 |

Etching condition A: Using an etching soltuion containing 200 g/l of CuCl$_2$.2H$_2$O, 150 g/l of HCl, etching was performed at 45° C. for 15 minutes.
Etching condition B: Using an etching solution containing 250 g/l of (NH$_4$)$_2$S$_2$O$_8$, 50 g/l of H$_3$PO$_4$, etching was performed at 45° C. for 13 minutes.
*Peel strength test: JIS C 6481 - 1976, Paragraphs 5-7

I claim:

1. A copper-clad laminated board for preparing a printed circuit consisting of a highly electroconductive pattern which comprises a resin substrate and a copper foil laminated on said substrate, said copper foil having a resin substrate bonding surface coated completely with a layer 0.02 to 0.2 micron thick consisting essentially of a phosphorus-containing nickel layer formed by electro-desposition, said substrate being in face-to-face contact with said bonding surface of said copper foil, said nickel layer containing 0.05 to 10% by weight of phosphorus and being easily etchable with an ammonium persulfate etching solution.

2. The copper clad laminated board of claim 1, wherein said nickel layer contains from 1 to 8.7% phosphorus.

3. The copper clad laminated board of claim 1, wherein said nickel layer contains from 2 to 8% phosphorus.

4. The copper clad laminated board of claim 1, wherein said nickel layer contains from 2 to 7% phosphorus.

* * * * *

UNITED STATES PATENT AND TRADEMARK OFFICE
CERTIFICATE OF CORRECTION

PATENT NO. : 4,935,310

DATED : June 19, 1990

INVENTOR(S) : NAKATSUGAWA, Hiroshi

It is certified that error appears in the above-identified patent and that said Letters Patent is hereby corrected as shown below:

--73762  4/1973  Japan--.

Column 2, line 33, change "becam" to --became--.

Column 4, line 33, delete "seen".

Signed and Sealed this

Twenty-eighth Day of July, 1992

*Attest:*

DOUGLAS B. COMER

*Attesting Officer*     *Acting Commissioner of Patents and Trademarks*

UNITED STATES PATENT AND TRADEMARK OFFICE
CERTIFICATE OF CORRECTION

PATENT NO. : 4,935,310

DATED : June 19, 1990

INVENTOR(S) : Nakatsugawa, Hiroshi

It is certified that error appears in the above-identified patent and that said Letters Patent is hereby corrected as shown below:

Column 2, line 33, change "becam" to --became--.

Column 4, line 33, delete "seen".

This certificate supersedes Certificate of Correction issued July 28, 1992.

Signed and Sealed this

Fifth Day of January, 1993

Attest:

DOUGLAS B. COMER

Attesting Officer     Acting Commissioner of Patents and Trademarks

UNITED STATES PATENT AND TRADEMARK OFFICE
CERTIFICATE OF CORRECTION

PATENT NO. : 4,935,310
DATED      : June 19, 1990
INVENTOR(S): NAKATSUGAWA, Hiroshi It is certified that error appears in the above-identified patent and that said Letters Patent is hereby corrected as shown below:

Column 2, line 51, after "stains", insert --do--.

Signed and Sealed this

Third Day of August, 1993

Attest:

MICHAEL K. KIRK

Attesting Officer    Acting Commissioner of Patents and Trademarks